United States Patent
May et al.

(10) Patent No.: US 6,215,423 B1
(45) Date of Patent: Apr. 10, 2001

(54) METHOD AND SYSTEM FOR ASYNCHRONOUS SAMPLE RATE CONVERSION USING A NOISE-SHAPED NUMERICALLY CONTROL OSCILLATOR

(75) Inventors: Marcus W. May; C. Eric Seaberg, both of Austin, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/145,778

(22) Filed: Aug. 26, 1998

(51) Int. Cl.[7] .............................. H03M 7/00; H03M 3/00
(52) U.S. Cl. ............................... 341/61; 341/143
(58) Field of Search .............................. 341/61, 143, 144, 341/77; 327/105; 375/354; 364/724.1

(56) References Cited

U.S. PATENT DOCUMENTS

| | | | |
|---|---|---|---|
| 5,489,903 | * | 2/1996 | Wilson et al. .................. 341/144 |
| 5,497,152 | * | 3/1996 | Wilson et al. .................. 341/61 |
| 5,638,010 | * | 6/1997 | Adams .......................... 327/105 |
| 5,748,126 | * | 5/1998 | Ma et al. ...................... 341/143 |

OTHER PUBLICATIONS

Stewart et al, "Oversampling and Sigma–Delta Strategies for Data Conversion," Electronics & Communication Engineering Journal, 37–47, Feb. 1998.*

Su et al, "A CMOS Oversampling D/A Converter with a Current–Mode Semidigital Reconstruction Filter," IEEE Journal of Solid–State Circuits, 1224–1233, Jul. 1993.*

Tom Kwan, et al, "A Stereo Multibit $\Sigma\Delta$ DAC with Asynchronous Master–Clock Interface", IEEE Journal of Solid–State Circuits, vol. 31, No. 12, Dec. 1996, pp. 1881–1886.

\* cited by examiner

Primary Examiner—Patrick Wamsley
(74) Attorney, Agent, or Firm—Robert L. King; Craig J. Yudell

(57) ABSTRACT

Asynchronous sample rate conversion is performed using a noise-shaped numerically controlled oscillator (204,420) that generates a clock (207,428) that is synchronous to the system clock (217,424) but having a time average frequency that is equal to a multiple (X) of the asynchronous sample rate frequency required for the conversion. Unwanted spectral energy in the generated clock (207,428) is noise-shaped out of the pass-band and so does not degrade signal performance. For digital-to-analog conversion, the generated clock (207) is used to time an interpolation (206) of digital data ($DATA_{Fs}$) by an multiple X to produce an interpolated signal ($DATA_{FsX}$) having a time average rate equal to the over-sampling frequency but being synchronized with the system clock (217). The interpolated signal ($DATA_{FsX}$) is then converted (216) to an analog signal using a derivative of the system clock (217), or can be output as digital data at the rate derived from the system clock. For analog-to-digital conversion, the generated clock (428) clocks an analog-to-digital conversion (415) synchronous with the system clock but having a time average of the over-sampling frequency. It can be seen the present invention performs asynchronous sample rate conversion without the need for an analog PLL and with simplified circuitry such that no multipliers or DSP utilization is required.

6 Claims, 4 Drawing Sheets

METHOD AND SYSTEM FOR ASYNCHRONOUS SAMPLE RATE CONVERSION USING A NOISE-SHAPED NUMERICALLY CONTROL OSCILLATOR

FIELD OF THE INVENTION

The present invention relates in general to digital signal processing and, more particularly, to a method and system for asynchronous digital sample rate conversion.

BACKGROUND OF THE INVENTION

In many electronics applications, analog signals must be digitally encoded or decoded at any one of a number of sample rates depending on a selected mode of operation. In the field of digital signal processing (DSP), analog conversion is required to receive/transmit analog signals to/from a digital environment. The sample rate or sample frequency ($F_s$) used for the conversion for each application will be dependent upon the nature of the analog data. For example, DSP applications that require analog conversion at different sample rates include receiving and transmitting modem data, playing compact disk audio ($F_s$=44.1 kHz), transmitting and receiving voice data ($F_s$=8 kHz).

When designing a system or semiconductor device to implement multi-functional DSP, it is very limiting to only allow the system to implement functions having sample rates that are divisible from a practical crystal frequency. Thus, it is necessary to generate a clock asynchronous to the crystal to perform the sampling. In the prior art, a phase locked loop (PLL) generates the required clock for the digital-to-analog (D/A) or analog to-digital (A/D) conversions.

As seen in FIG. 1, there is shown a digital signal processing system of the prior art using a PLL to generate the sample clock used to produce the digital-to-analog conversion. System 100 includes a digital signal processor (DSP) 110 that performs a specified function on the received digital data (DATA), and outputs modified data (DATA Fs (SAMPLE)) to a D/A converter 120 to generate the required analog output. For example, system 100 could be a computer modem for converting digital data and outputting the equivalent analog data on a telephone line. In order to produce the appropriate input clock for the D/A converter 120, PLL 130 locks to a clock ($CLK_{F_s}$) operating at the frequency ($F_s$) of DATA. PLL 130 locks to $CLK_{F_s}$ and generates an output clock $CLK_{F_sX}$ having a frequency equal to $F_s$ times X, wherein X is a selected number that provides the appropriate sampling clock for the D/A converter 120. In this way, the PLL is used to produce the necessary asynchronous clock, relative to the system clock ($CLK_O$), to properly convert the DSP 110 output data into analog data.

The use of a PLL to produce the asynchronous clock for analog conversion has significant commercial disadvantages. For example, it is difficult to make a low noise PLL device, that does not affect conversion performance. Also, verification of the device performance is complicated because long simulation times are required to simulate the mixed-mode operation of a PLL, and further a PLL circuit is much more process sensitive than standard digital circuits.

Another prior art solution to this problem of sample rate conversion is to perform additional processing within the DSP to perform the digital sample rate conversion. This conversion allows the converter to be clocked at a frequency derived from the system clock frequency. This solution eliminates the need for a PLL. However, this solution is difficult and costly to implement in terms of the increased number of instructions required and it also has higher power consumption from the increased use of the multiplier to obtain a high quality result.

As can be seen, there is a need for an accurate, simple and robust solution to asynchronous sample rate conversion that does not have the design disadvantages of the phase lock loop solution and the high signal processing requirements of the DSP solution.

DESCRIPTION OF A PREFERRED EMBODIMENT

The present invention provides a method and system for asynchronous sample rate conversion using a noise-shaped numerically controlled oscillator that generates a clock that is synchronous to the system clock but having a time average frequency that is equal to a multiple of the asynchronous sample rate frequency required for the conversion. Unwanted spectral energy in the generated clock is noise-shaped out of the pass-band and so does not degrade signal performance. For digital-to-analog conversion, the generated clock is used to update an interpolation of digital data to produce an interpolated signal that is converted to analog utilizing integer derivative of the system clock. For analog-to-digital conversion, the generated clock is used to time an analog-to-digital conversion of the analog data that is synchronous with the system clock but having a time average of the asynchronous over-sampling frequency. It can be seen the present invention performs asynchronous sample rate conversion without the need for an analog PLL and simplifying the circuitry such that no multipliers or DSP utilization is required.

Figure 1:
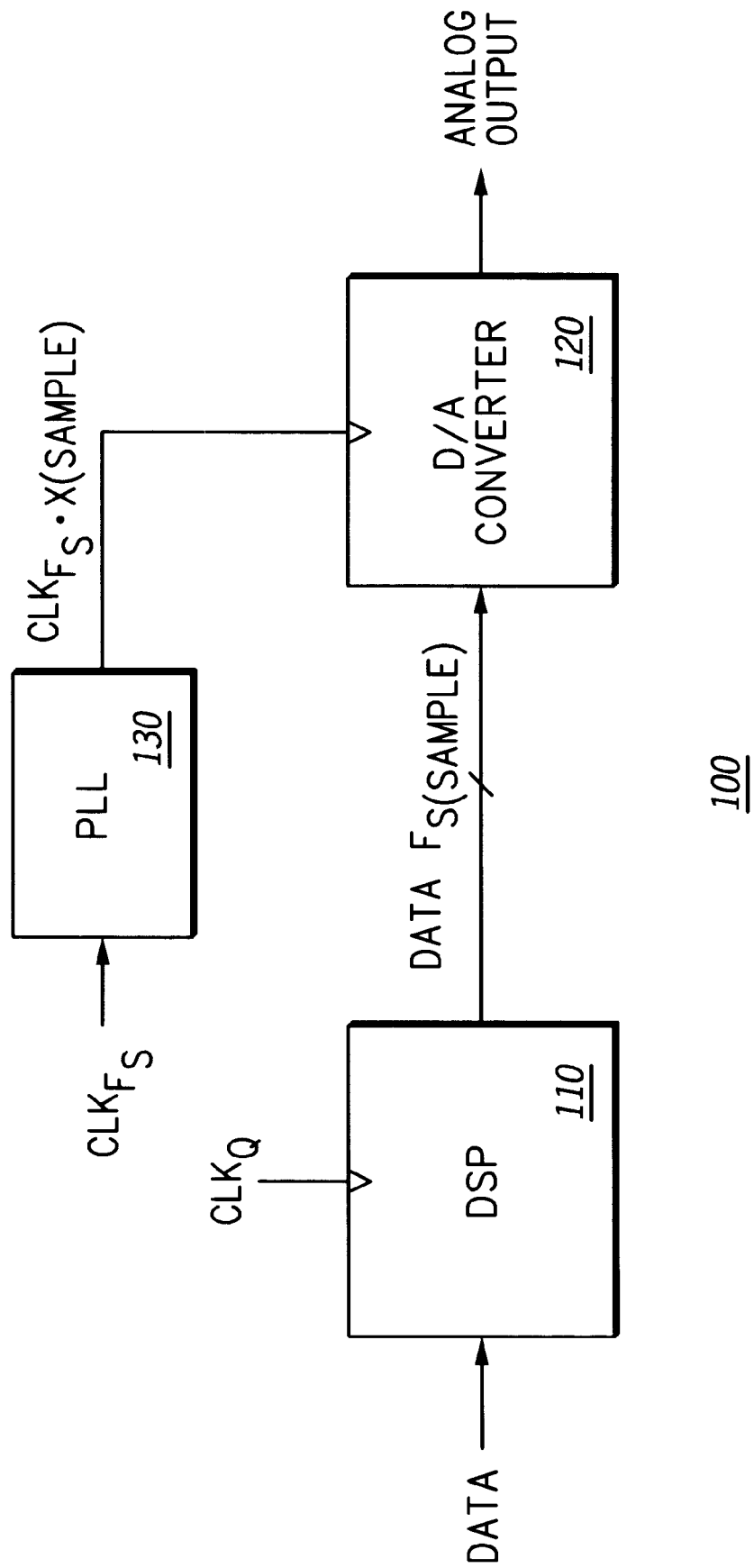
FIG. 1 shows a digital signal processing system of the prior art using a PLL to generate the sample clock used to produce the digital-to-analog conversion.
Figure 2:
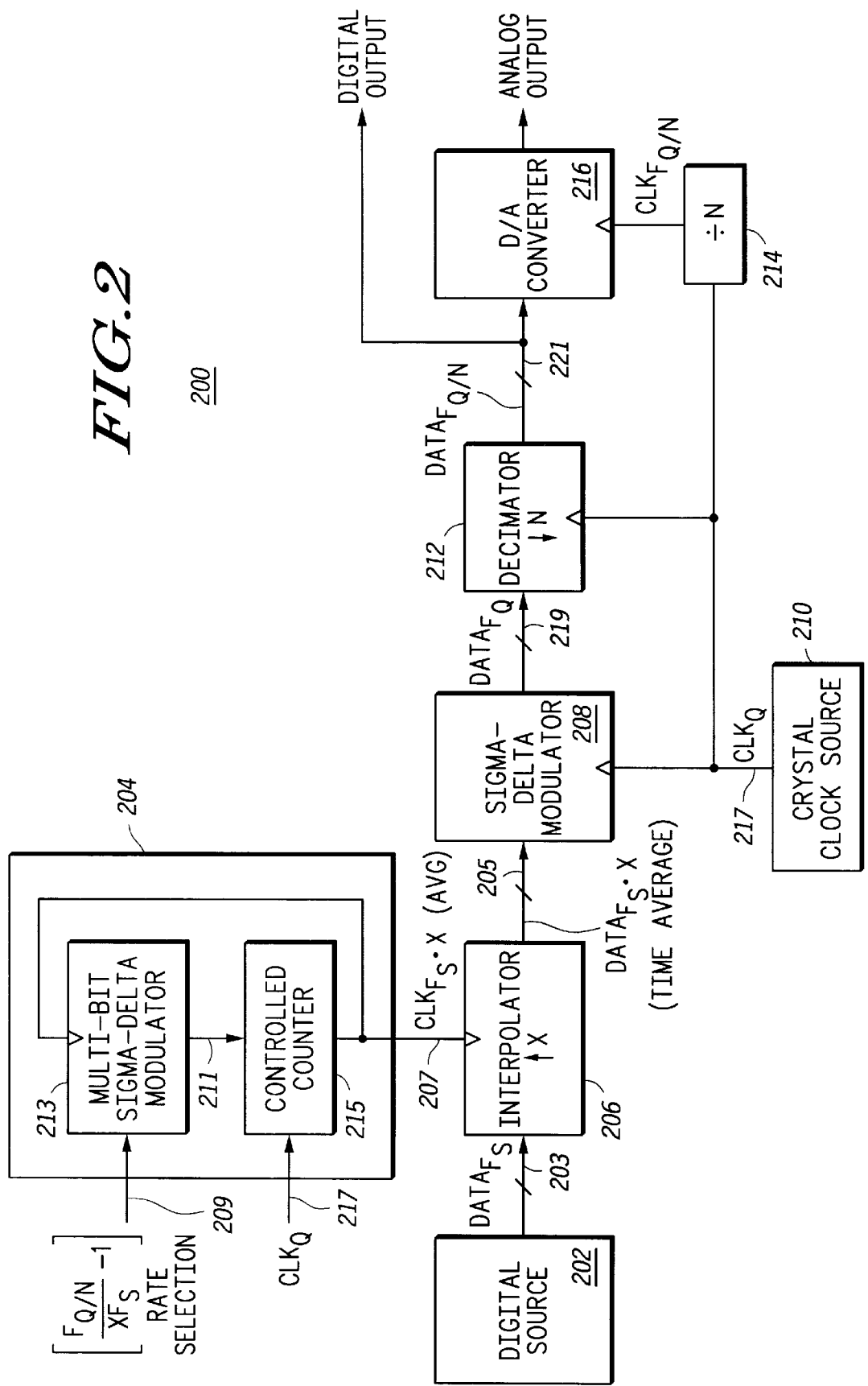
FIG. 2 shows a circuit for performing a digital-to-analog (D/A) conversion in a mixed-signal DSP, in accordance with a preferred embodiment of the present invention.

With reference to FIG. 2, there is shown a circuit for performing a digital-to-analog (D/A) conversion in a mixed-signal system, in accordance with a preferred embodiment of the present invention. Circuit 200 performs a digital-digital sample rate conversion or an analog conversion of the output of digital source 202. Digital source 202 represents any type of digital source that may produce, in one embodiment, a single type of data (for example, such as a CD player) or, in an alternative embodiment, multiple types of data that are each sampled at a different sample rate (for example, such as a routing device or a DSP producing either modem or voice data). The sample rate or sample frequency ($F_s$) used for the conversion for each application will be dependent upon the nature of the analog data. For example, DSP applications that require analog conversion at different sample rates include receiving and transmitting modem data, playing compact disk audio ($F_s$=44.1 kHz), transmitting and receiving voice data ($F_s$=8 kHz).

Digital source 202 outputs digital data (DATA $F_s$) onto a bus 203 at a frequency $F_s$. Interpolator 206 receives the data on bus 203 and performs an interpolation of the data to increase the sample rate of $DATA_{F_s}$ by a multiple X to the over-sampling rate. The multiple X is selected such that interpolator 206 increases the sample rate to approximately the sample rate required for D/A converter 216 to perform the conversion at a frequency derived from the system clock ($CLK_Q$). Since the sample rate of the sigma-delta modulator 208 is a derivative of the crystal clock source 210, the output of interpolator 206 on bus 205 must be synchronized with the crystal clock output. This is accomplished by clocking interpolator 206 with an oversample rate clock ($CLK_{F_sX}$ (AVG)) 207 generated by a specialized numerically controlled oscillator (NCO) 204.

NCO 204 includes a multi-bit sigma-delta modulator 213 and a controlled counter 215. Multi-bit sigma-delta modulator 213 is clocked by clock signal 207 and controlled counter 215 is clocked by the system clock 217. Multi-bit sigma-delta modulator 213 receives a rate selection signal 209 as an input and generates control signal 211 to control counter 215.

Rate selection signal 209 is a preselected constant signal that is selected to be the ratio of a derivative of the system clock and the over-sampled frequency for the data type output by digital source 202 (for a given application). As seen in FIG. 2, rate selection 209 is selected to equal a derivative of the system frequency divided by the over-sampled frequency minus one, as shown by equation 1:

$$\left[\frac{F_Q/N}{F_S X} - 1\right] \quad (1)$$

One is subtracted from the fraction to center the rate selection input to around the middle the multi-bit sigma-delta modulator's input range.

In response to the rate selection signal, multi-bit sigma-delta modulator 213 generates a control signal 211, which is an estimate (represented by a number of system clock cycles) of the phase difference between the over-sampling frequency (FSX) and the closest multiple of the system clock frequency (crystal clock source 210 generates the system clock ($CLK_Q$) 217 that clocks controlled counter 215, sigma-delta modulator 208, decimator 212, and D/A converter 216). The ability of a sigma-delta modulator to accurately resolve a constant input and place the noise out of the base band, permits the over-sampling clock to be phase aligned to the system clock without creating significant in band noise components.

Controlled counter 215 is set to a count by the control signal 211 and counts the edges of the system clock ($CLK_Q$) 217. Controlled counter 215 generates an output clock edge on signal 207 each time it counts a number of received system clock edges equal to the count. This produces a clock signal ($CLK_{F_sX}$) 207 having a time average frequency equal to $F_s$ times X but that is synchronous to the system clock, wherein X is a selected number that provides the appropriate over sampling for the signal conversion. As will now be appreciated, controlled counter 215 converts the estimate of the phase difference between the over-sampling frequency and the closest multiple of the system clock frequency into a phase modulated clock ($CLK_{F_sX}$) 207 having a time average frequency equal to $F_S$ times X, but which is synchronous with the system clock $CLK_Q$.

By clocking interpolator 206 with the oversample rate clock ($CLK_{F_sX}$) 207 generated by specialized numerically controlled oscillator (NCO) 204, the data output ($DATA_{FSX}$) of interpolator 206 on bus 205 is synchronized with the system clock output, but has a time average sample frequency of FsX. The data on bus 205 is input into sigma-delta modulator 208, clocked at the system clock frequency ($CLK_Q$), to provide a sigma-delta modulated representation of the interpolated data at the system clock frequency.

The sigma-delta modulator 208 allows the synchronized data signal ($DATA_{FSX}$) on bus 205 to be efficiently interpolated up to the system frequency as a single bit output data signal ($DATA_{F_Q}$) on bus 219. In a preferred embodiment, bus 219 is input into decimator 212 to decimate the frequency of $DATA_{F_Q}$ down by a factor of N to some sub-multiple frequency ($F_{Q/N}$) of the system clock frequency. The decimated data ($DATA_{FQ/N}$) on bus 221 is processed by D/A converter 216 to produce the analog output of the system 200. Alternatively, the sample rate converted data $DATA_{FQ/N}$ on bus 221 could be a digital output of the system. In a preferred embodiment D/A converter 216 is a sigma-delta D/A converter.

Figure 3:
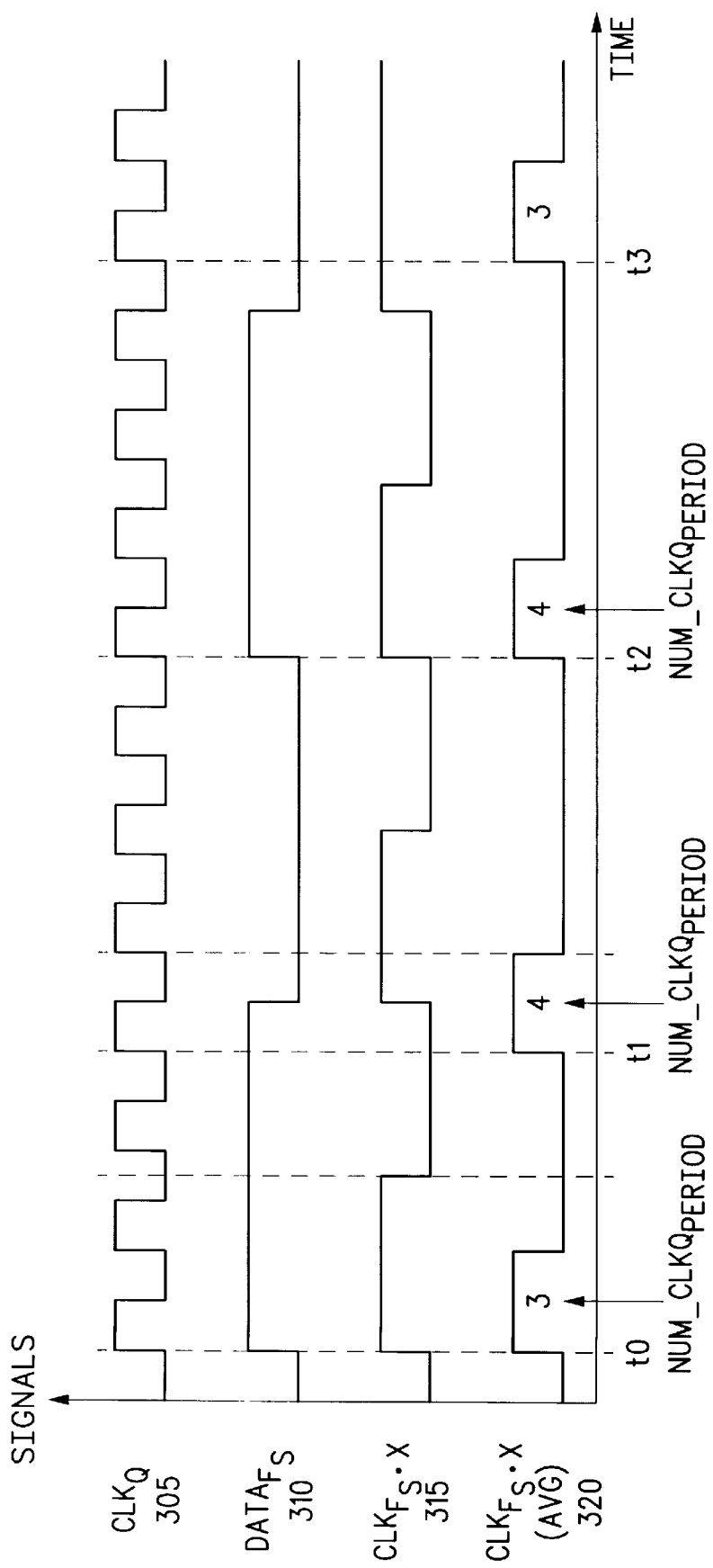
FIG. 3 shows a timing diagram for one example of the timing of system 200, in accordance with a preferred embodiment of the present invention.

With reference now to FIG. 3, there is shown a timing diagram for one example of the timing of system 200, in accordance with a preferred embodiment of the present invention. The system clock signal ($CLK_Q$) 305 shows the crystal clock ($CLK_Q$) generated by crystal clock source 210. Signal 310 shows the data input signal at the sampling frequency of $F_s$($DATA_{F_s}$). Provided for the reader's reference is signal 315 showing an idealized clock signal operating at a selected multiple of the over-sampling frequency. Signal 320 shows the actual over-sampling clock (signal 207 in FIG. 2) generated by numerically controlled oscillator 204, in accordance with a preferred embodiment of the present invention. Signal 320 has been phase modulated by NCO 204 such that the noise shaping function of the sigma-delta modulator 213 has pushed the phase noise of signal 320 outside of the base band of interest. It should be noted that the time average frequency of clock signals 315 and 320 are the same, but most importantly, signal 320 is synchronized with the system clock 305, while signal 315 is not.

As seen in FIG. 3, the number period ($NUM_{13}CLKQ_{PERIOD}$) indicates the number of system clock periods that comprises each period of clock 320. This number is generated by multi-bit sigma-delta modulator 213 as a function of the rate selection 209 and output as signal 211. Over time, this number will switch between multiple digital values to produce an average value of the digital numbers. This average value will be equal to the rate selection input. For example, the number of system clock periods indicated by signal 211 during the period between time $t_0$ and time $t_1$ is shown in FIG. 3 to be three system clock periods. Similarly, during the period between time $t_1$ and time $t_2$ signal 211 indicates four system clock cycles. Thus, the time average period of signal 320 is equal to 3.5 system clock periods which is equal to the actual over-sampling rate period of signal 315.

Figure 4:
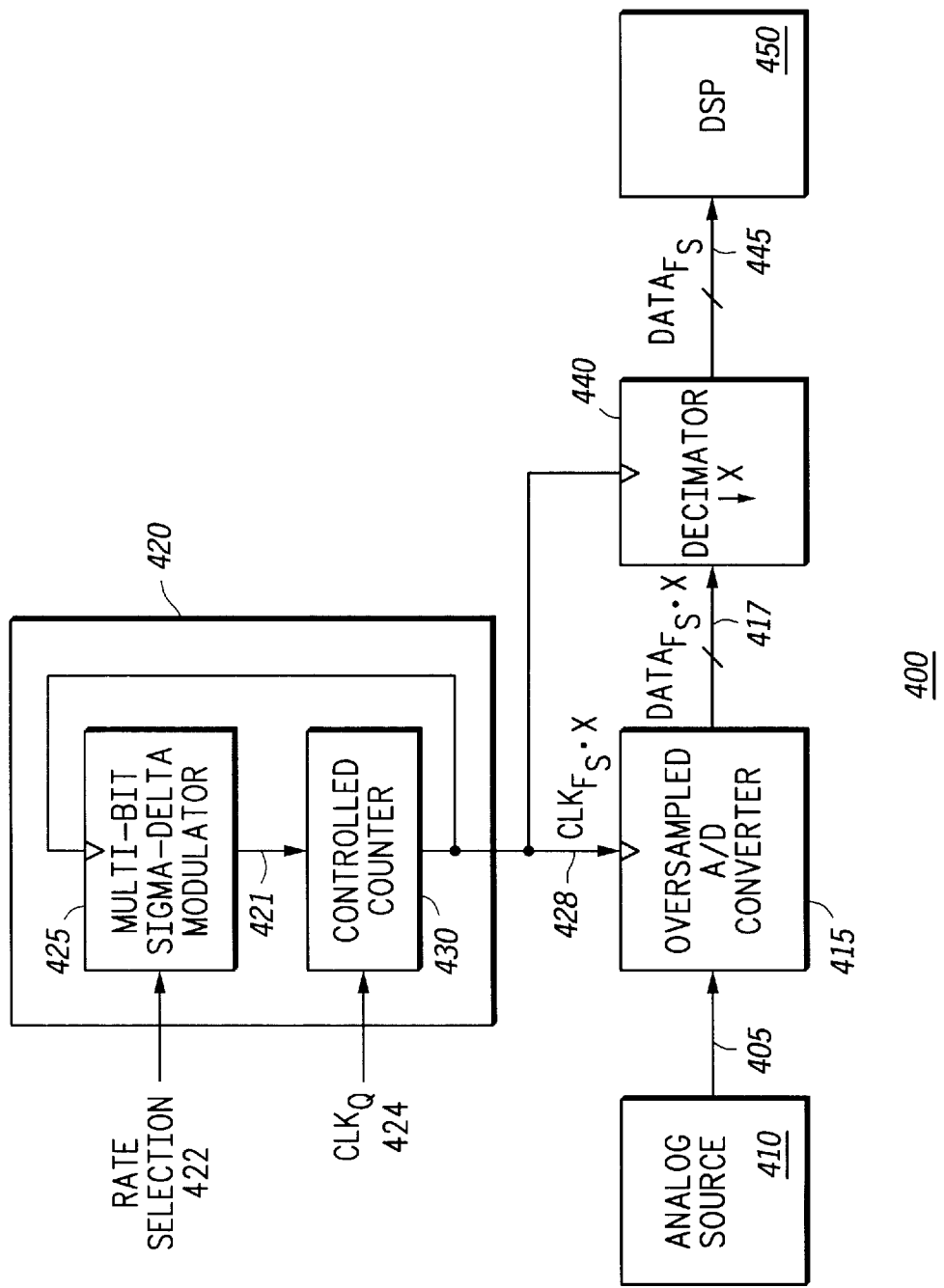
FIG. 4 shows a circuit for performing an asynchronous sample rate analog-to-digital (A/D) conversion in a mixed-signal system, in accordance with a preferred embodiment of the present invention.

With reference now to FIG. 4, there is shown a circuit for performing an asynchronous sample rate analog-to-digital (A/D) conversion in a mixed-signal system, in accordance with a preferred embodiment of the present invention. System 400 includes an analog source 410 that outputs an analog signal 405 to over-sampled A/D converter 415. NCO 420 provides an over-sample clock ($CLK_{F_sX}$) to sigma-delta A/D converter 415 to produce output data 417 ($DATA_{F_sX}$) at the over-sample frequency ($F_SX$).

NCO 420 includes multi-bit sigma-delta modulator 425 and controlled counter 430. Similar to NCO 204, multi-bit sigma-delta modulator 425 is clocked by the output 428 of NCO 420 and receives a rate selection signal 422 providing an estimate of the frequency difference between over-sample frequency desired to clock the sigma-delta A/D converter 415 and a derivative of the system clock frequency. Multi-bit sigma-delta modulator 425 produces a control signal 421 that operates as a control input to controlled counter 430. Control signal 421 operates to set the count of the controlled counter 430. Controlled counter 430 generates the oversampling clock (CLK$_{FsX}$) 428 by counting the number of system clock cycles of signal 424 specified by control signal 421. As was explained previously with respect to FIG. 3, this creates an over-sampling clock that is synchronous to the system clock, yet has a time average that is equal to the over-sampling frequency required to convert the analog signal. As will be appreciated, this produces the data signal (DATA$_{FsX}$) 417 at the over-sampling frequency, which is then decimated down by a factor of X by a decimator 440. Decimator 440 lowers the sample rate of the data down to the desired sample frequency (F$_s$) that is output as signal (DATA$_{Fs}$) 445 to DSP 450. As will be appreciated, DSP 450 receives digital data at the sample frequency of the particular application for the data and this frequency is in no way dependent on the system clock frequency.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

What is claimed is:

1. A method for asynchronous sample rate conversion, comprising the steps of:
   receiving data having a sample frequency, the sample frequency being asynchronous with a system clock signal having a system frequency;
   interpolating the data to provide an oversampled information signal having a new frequency in response to a first clock signal, the new frequency having an average value and having substantially all phase noise removed from a frequency band of interest;
   using a numerically controlled oscillator to generate the first clock signal, the numerically controlled oscillator receiving a numerical control signal and the system clock signal, the numerical control signal representing a difference in frequency between a first multiple of the system frequency and a second multiple of the sample frequency;
   providing the first clock signal at an oversampling frequency which is synchronized to the system clock signal and having minimal frequency components associated with a predetermined base bandwidth of interest, the first clock signal having a significantly lower frequency than the system clock signal; and
   processing the oversampled information signal by phase modulating with a sigma-delta modulator the data while maintaining substantially the same frequency content of the data within the predetermined base bandwidth of interest; and
   decimating the data to provide the data at a predetermined output frequency synchronous to the system clock signal.

2. The method of claim 1 wherein the step of receiving data further comprises receiving a digital stream of data and the data is converted to an analog form after the step of decimating.

3. The method of claim 1 wherein the step of providing the first clock signal further comprises:
   using a second sigma-delta modulator to provide a count signal which is a quantized number of system clock periods in a predetermined first clock signal period; and
   counting cycles of the system clock signal in response to the count signal to provide the first signal therefrom, the steps of providing a count signal and counting cycles of the system clock signal removing substantially all phase noise associated with the first clock signal out of the predetermined base bandwidth of interest.

4. An asynchronous sample rate converter using a noise shaped numerically controlled oscillator, comprising:
   a source of digital information for providing information at a sample rate;
   an interpolator coupled to the source of digital information, the interpolator providing an oversampling information signal having a new rate in response to an oversampling clock, the new rate having an average value and having all phase noise removed from a frequency band of interest;
   a numerically controlled oscillator coupled to the interpolator for providing the oversampling clock in response to a numerical control signal and a system clock, the numerical control signal representing a rate difference between the information at a sample rate and a multiple of the system clock;
   a sigma delta modulator coupled to the interpolator for providing the information at a system clock rate which is interpolated from the new rate of the oversampling information signal; and
   a decimator coupled to the sigma delta modulator, the decimator providing the information at a rate of a multiple of the system clock, where a divisor which determines the multiple of the system clock is a decimation rate;
   the information provided by the decimator being suitable for further digital processing or D/A conversion at the rate which is the multiple of the system clock and synchronous to the system clock.

5. The asynchronous sample rate converter of claim 4 further comprising:
   an oversampling converter coupled to an output of the decimator, the oversampling converter providing an analog representation of the source of digital information.

6. An asynchronous sample rate converter using a noise shaped numerically controlled oscillator, comprising:
   an interpolator having an input for receiving a source of digital information having a sample rate, the interpolator providing an oversampled information signal having a new rate in response to an oversampled clock signal, the new rate having an average value and having all phase noise removed from a frequency band of interest;
   a numerically controlled oscillator coupled to the interpolator for providing the oversampled clock signal in response to a numerical control signal and a system clock signal, the numerical control signal representing a rate difference between the sample rate of the digital information and a multiple of the system clock signal;
   a sigma delta modulator coupled to the interpolator for providing the information at a system clock signal rate which is interpolated from the new rate of the oversampled information signal; and
   a decimator coupled to the sigma delta modulator, the decimator providing the digital information at a rate which is a multiple of the system clock signal, where a divisor which determines the multiple of the system clock signal is a decimation rate;
   the information provided by the decimator being suitable for further digital processing or digital-to-analog conversion.

* * * * *